United States Patent [19]

Hara et al.

[11] 4,231,032
[45] Oct. 28, 1980

[54] VARIABLE ACCURACY TREND GRAPH DISPLAY APPARATUS

[75] Inventors: Toshitaka Hara; Nagaharu Hamada, both of Hitachi, Japan

[73] Assignee: Hitachi, Ltd., Japan

[21] Appl. No.: 940,367

[22] Filed: Sep. 7, 1978

[30] Foreign Application Priority Data

Sep. 9, 1977 [JP] Japan .................................. 52-107720

[51] Int. Cl.$^2$ ............................................. G06F 3/14
[52] U.S. Cl. .................................... 340/703; 340/747; 340/728; 340/734
[58] Field of Search ............... 340/703, 747, 701, 728, 340/722, 734

[56] References Cited

U.S. PATENT DOCUMENTS

| | | | |
|---|---|---|---|
| 3,686,662 | 8/1972 | Blixt et al. | 340/747 |
| 3,725,901 | 4/1973 | Lehari | 340/747 |
| 3,739,369 | 6/1973 | Bunker | 340/701 |
| 3,812,491 | 5/1974 | Barraclough et al. | 340/747 |
| 3,894,292 | 7/1975 | Wilkinson et al. | 340/747 |
| 4,074,281 | 2/1978 | Quarton | 340/747 |
| 4,127,849 | 11/1978 | Okor | 340/747 |

*Primary Examiner*—Marshall M. Curtis
*Attorney, Agent, or Firm*—Craig & Antonelli

[57] ABSTRACT

A graph display apparatus using a CRT display unit of raster scanning type for displaying a graph with a high accuracy, that is, a high resolution. The apparatus comprises a raster counter for counting the number of rasters to identify the raster number of the scanning lines presently scanning the display screen of the CRT display unit, and a plurality of graph display units for displaying a graph with a standard accuracy. Each graph display unit comprises a memory having a capacity corresponding to the number of time points obtained by dividing the time axis extending in the scanning direction of the raster on the display screen by the number n of data plotting for storing the raster numbers corresponding to the levels of the quantities to be displayed at the individual time points, and a comparator comparing the output of the raster counter with the output of the memory read out sequentially in timing relation with the individual time points for providing a coincidence detection signal only when coincidence is reached between the output of the counter and the output of the memory at a time point. The display signal outputs of these graph display units are combined to display a graph with a desired resolution which is for example two or four times the standard resolution. To this end, a variable accuracy circuit is associated with each of the graph display units to receive the output of the associated graph display unit thereby providing a display signal output at the timing of scanning specific dots among a plurality of dots corresponding to one time point. The outputs of the variable accuracy circuits are applied to an OR circuit which applies an output signal representing the logical sum of these inputs to the CRT display unit.

6 Claims, 10 Drawing Figures

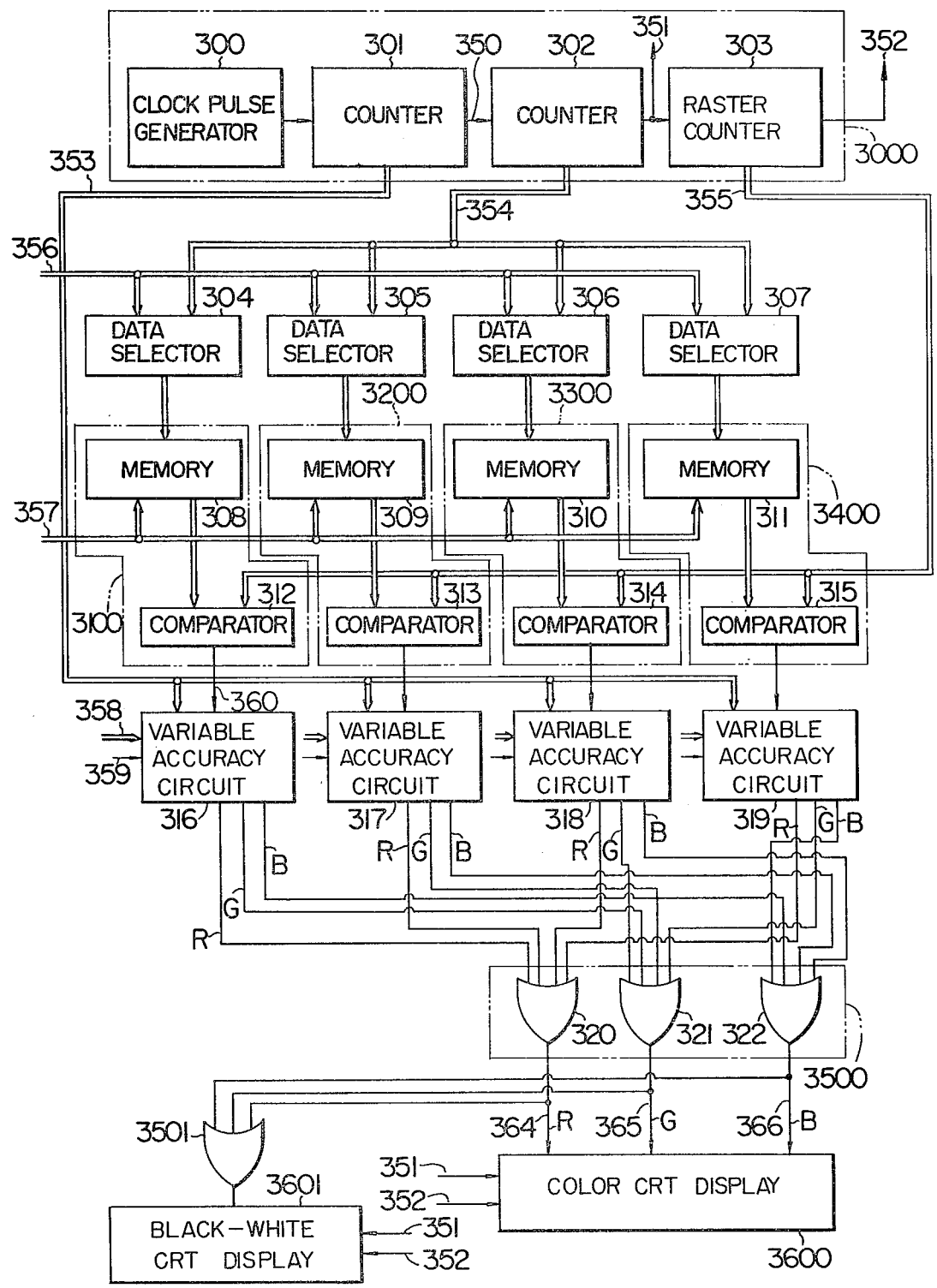

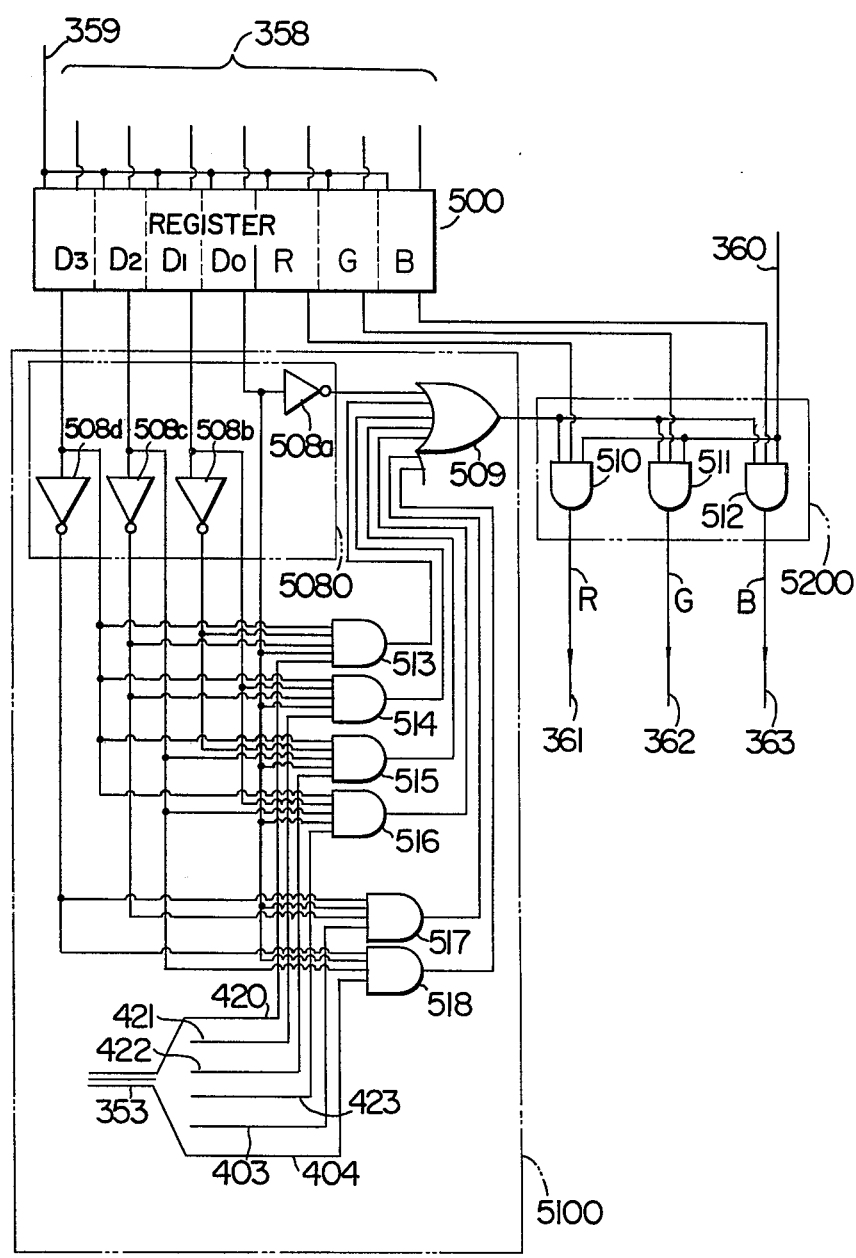

VARIABLE ACCURACY TREND GRAPH DISPLAY APPARATUS

BACKGROUND OF THE INVENTION

This invention relates to an apparatus for displaying a graph on a display screen (for example, the phosphor screen of a cathode-ray tube), and more particularly to a graph display apparatus in which means are provided so that the accuracy or delicacy of display (resolution of display) can be varied as required.

Display apparatus using raster scanned cathode-ray tubes for display are generally classified into a graphic display apparatus capable of relatively freely displaying a graph, a drawing, etc. on its display screen, and a character display apparatus capable of displaying characters, simple symbols, etc. on its display screen according to a combination of predetermined patterns.

The graphic display apparatus includes a memory which stores, for example, a data for unblanking selected ones of all the dots on the display screen (the dot being the minimum unit of display element on the display screen). The memory also stores data instructing the state of display by the dots, for example, the color of the unblanking or displaying dots. The data stored in the memory are read out to be supplied to the display unit including the cathode-ray tube in synchronous relation with the scanning of dots with the electron beam so as to selectively unblank the dots in the instructed positions in the desired color thereby displaying a desired graph or pattern on the display screen. Such a graphic display apparatus can display many graphs or patterns on its display screen at the same time since all the data corresponding to the individual dots on the display screen are stored in the memory. However, the capacity of the memory in this graphic display apparatus is very large due to the fact that all the data corresponding to the individual dots on the display screen must be stored in the memory. For instance, a memory capacity of $1,024 \times 1,024 = 1,048,576$ bits is required in the case of display by a cathode-ray tube (CRT) having a display area of 1,024 bits in the horizontal direction and 1,024 bits in the vertical direction of the display screen. The above figure represents the case of black-and-white display. In the case of color display with seven colors, 3-bit color information is required for each individual dot, and therefore, the required memory capacity is three times as large as that of the memory capacity required for the black-and-white display. The increase in the memory capacity results not only in an increase in the scale of the memory, but also in an extended length of time required for the writing and reading of dot information, and this leads to a delayed response of the display apparatus. This delayed response is objectionable in a process control or like system in which the state of process control is continuously monitored while viewing the display screen of such a display apparatus.

Thus, the commonly known graphic display apparatus involves the problem of complex circuitry and large scale and the problem of delayed response.

In contrast to such a graphic display apparatus, an apparatus is known wherein one graph display unit can operate at a high response rate and can realize the desired accurate graph display in spite of its simple structure although it can only display a single graph on the display screen of a CRT. Such a display unit is disclosed in, for example, Japanese Patent Publication No. 51-48862. The basic principle of the disclosed display unit will now be described. According to the basic principle of the display unit displaying a single graph, the time axis extending in the horizontal direction of the display screen of the CRT is equally divided into n parts, and T/n, obtained by dividing the scanning time T of one raster by the number n, is called one time point. This one time point is used as a unit for the plotting of graph display, and a memory is prepared to cover these time points so as to store the process variable of the inputs to be displayed at the individual time points. The term "process variable to be displayed" is used herein to designate the so-called vertical height relative to the horizontal direction of the display screen of the CRT. This height can be represented by the raster number of the scanning line scanning horizontally across the display screen of the CRT of the so-called raster scanning type. Thus, the raster numbers corresponding to the process variable to be displayed at the individual time points are stored in the memory, and during the scanning, the contents of the memory at the individual time points are sequentially read out. When the output of the memory corresponding to a specific raster number at a specific time point coincides with the output of a raster counter representing the present scanning position of the raster, corresponding dots on the display screen being scanned by the raster are caused to unblank at the specific time point. In this manner, a graph can be displayed on the CRT display screen by storing in a memory the raster numbers (corresponding to the process variable to be displayed) at the individual horizontally divided time points, sequentially reading out the contents of the memory during the scanning of the display screen by the raster, and causing the corresponding dots to unblank when coincidence is reached between the output of the memory and the output of the raster counter. According to this method, the memory capacity can be greatly reduced to quicken the response compared with the aforementioned graphic display apparatus, due to the fact that a memory having the same capacity as the number of horizontal time points is merely required. However, such a display unit is capable of only displaying a single graph. Therefore, two or more of such display units are prepared, and the outputs of these display units are applied to the CRT display unit through an OR circuit so as to display two or more graphs.

In the proposed display unit, the horizontal axis or time axis extending in the scanning direction of the raster is equally divided into n parts to provide n time points, and the process variable (actually, the raster numbers corresponding to the process variable) at these n time points are stored in the memory for displaying a graph. According to such an arrangement, however, a delicate or accurate graph display cannot be expected since only one information element is available for each time point. In other words, the graph cannot be displayed in the form of a smooth and continuous curve, and such a stepped display is relatively hard to be readily recognized by the eye.

SUMMARY OF THE INVENTION

It is an object of the present invention to provide a novel and improved graph display apparatus which is capable of displaying a graph with a high accuracy of high resolution in spite of a simple structure.

Another object of the present invention is to provide a graph display apparatus which can display a graph with a variable resolution as required.

Still another object of the present invention is to provide a graph display apparatus of simple structure which can display a graph in color.

In accordance with one of the features of the present invention, there is provided a graph display apparatus comprising a CRT display unit of raster scanning type, a raster counter counting the number of rasters to identify the raster number of the scanning line presently scanning the display screen of the CRT display unit, at least two graph display units each including a memory having a capacity corresponding to the number of time points on the time axis extending in the scanning direction of the raster on the display screen of the CRT display unit for storing the raster numbers corresponding to the process variable of the quantities to be displayed at the individual time points, and a comparator comparing the output of the counter with the output of the memory read out sequentially in timing relation with the individual time points for providing a coincidence detection signal output only when coincidence is reached between the output of the counter and the output of the memory, a variable accuracy circuit associated with each of the graph display units for receiving the output of the associated graph display unit thereby providing a display signal output at the timing of scanning of all or part of dots among a plurality of dots corresponding to one time point, and an OR circuit provided in common to all of the variable accuracy circuits to receive the outputs of the variable accuracy circuits for applying an output signal representing the logical sum of these inputs to the CRT display unit of raster scanning type.

The present invention is further featured by the fact that the variable accuracy circuit associated with each of the graph display units comprises a graph display mode register instructing the delivery timing of the display signal as desired during scanning of specific dots among the plural dots corresponding to one time point, a group of AND gates responding to the output of the register for selectively delivering a timing signal required for unblanking the specific dots, and an AND circuit providing an output signal representing the logical product of the output of the AND gate group and the coincidence detection signal.

The present invention is further featured by the fact that the graph display mode register includes additional bit stages for specifying the color and is connected to an AND circuit having terminals receiving the outputs of these color specifying bit stages of the register.

Other objects and features of the present invention will become more apparent from the following detailed description of a preferred embodiment thereof taken in conjunction with the accompanying drawings.

BRIEF DESCRIPTION OF THE DRAWINGS

FIG. 1 is displayed.

FIG. 5 is a block diagram of a preferred embodiment of the graph display apparatus according to the present invention.

FIG. 6 is a detailed view of part of the block diagram of FIG. 5.

DESCRIPTION OF THE PREFERRED EMBODIMENT

The present invention which attains the above objects provides a graph display apparatus comprising a plurality of graph display units so as to display a plurality of graphs. In the apparatus according to the present invention, attention is directed to the fact that a plurality of dots are allotted to each time point to display a graph relative to the same vertical axis. It is the basic idea of the present invention that one of the graph display units participates in unblanking some of the plural dots corresponding to each time point, and the remaining graph display units participate in unblanking the remaining dots. The accuracy or resolution of graph display depends on the number of dots handled by the individual graph display units.

A preferred embodiment of the present invention based on such an idea will now be described in detail with reference to the drawings.

Figure 1:
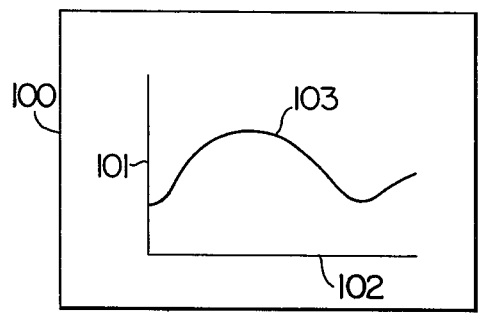
FIG. 1 illustrates a single trend graph displayed on the display screen of a CRT display unit.

FIG. 1 illustrates the manner of displaying a trend graph on a display screen 100 of a CRT. In this graph, the vertically extending axis is an amplitude axis 101 representing the amplitude of the process variable, and the horizontally extendinng axis bearing the time scale is a time axis 102. The amplitude values determined by the coordinates are plotted to provide a single graph line 103 as shown. This trend curve 103 is usually depicted by sequentially plotting the amplitude values at the individual time points on the time axis 102.

Figure 2A:
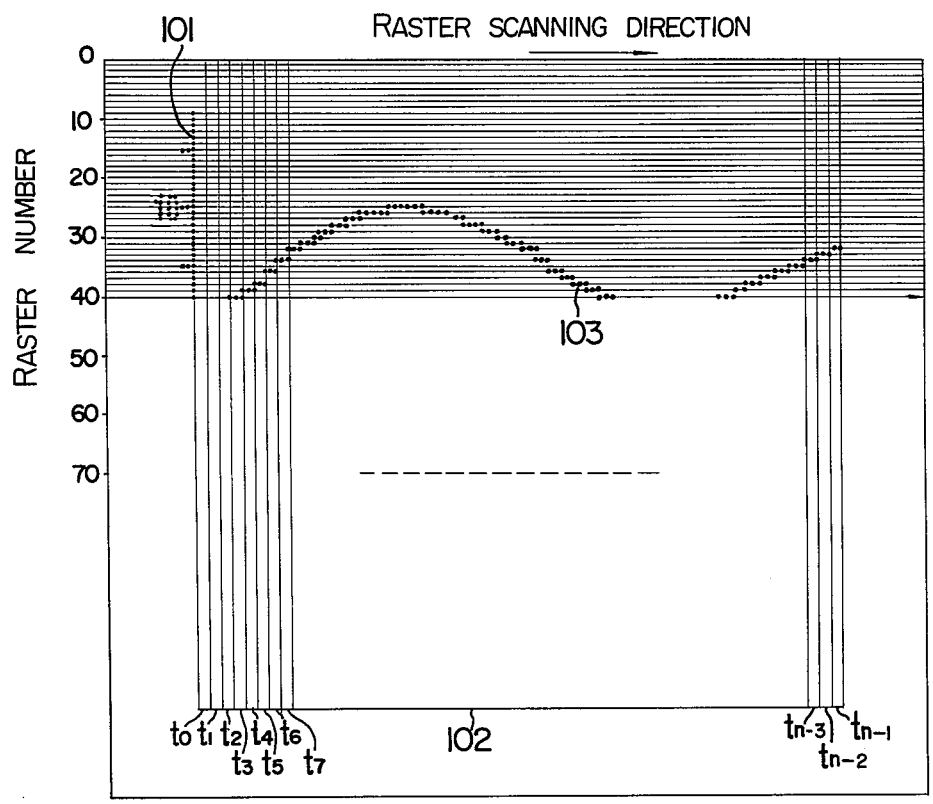
FIGS. 2A and 2B illustrate how the graph shown is
Figure 2B:
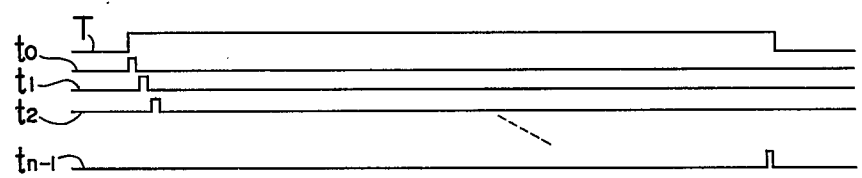

FIGS. 2A and 2B illustrate how a single graph as shown in FIG. 1 is displayed on the display screen 100. Referring first to FIG. 2A, $t_0$ to $t_{n-1}$ represent the positions on the horizontal or time axis and thus correspond to the respective time points. The raster scanning proceeds downward while scanning each raster in the horizontal direction. FIG. 2A shows that the scanning with the raster No. 40 has been completed, and the scanning with the raster No. 41 is about to take place. A memory stores n pieces of information for the time points $t_0$ to $t_{n-1}$. The n pieces of information for the time points $t_0$ to $t_{n-1}$ are sequentially read out at the scanning of each raster.

FIG. 2B shows how access to the memory is made for reading out the n pieces of information for the time points $t_0$ to $t_{n-1}$ during scanning with a raster No. i. This access is carried out in synchronous relation with the horizontal scanning. Suppose, for example, that the memory contents corresponding to the time points $t_3$ and $t_4$ represent the rasters No. 40 and No. 39 respectively, and that the scanning is now effected with the raster No. 39. Then, at the time point $t_3$, the information is read out from the memory representing the raster No. 40. Now the output of a scanning line or raster counter indicates that the raster which is now scanned is the raster No. 39, and the dots on the raster 39 and corresponding to the time point $t_3$ are blanked since there is no coincidence between the output of the counter which indicates the raster No. 39 and the information read out from the memory at the time point $t_3$ which represents the raster No. 40. At the time point $t_4$, the information which represents the raster No. 39 is read out from the memory and the dots on the raster No. 39 and corresponding to the time point $t_4$ unblank at this time point $t_4$ since the counter output represents now the raster No. 39. In this manner, the pieces of information corresponding to the individual time points $t_0$ to $t_{n-1}$ are sequentially read out from the memory to be compared with the content or output of the counter representing the presently scanning raster number. Thus, the graph shown in FIG. 1 can be displayed by applying a dot-activating display signal to the CRT only when coincidence is reached between the counter output and the information read out from the memory. Suppose that m is the number of dots corresponding to each time point, and M is the number of all the dots in the horizontal direction of the graph display area of the CRT. Then, m is obtained by dividing M by the number n dividing the time axis into n time points, that is, m is expressed as $m=M/n$ which is a constant value. It is thus apparent that finer plotting to provide a graph display of higher accuracy or resolution is impossible inasmuch as the value of m is constant. The resolution for the time axis 102 of the trend curve 103 in this case is called a standard resolution which is determined by the number n dividing the time axis 102 into n time points.

Figure 3:
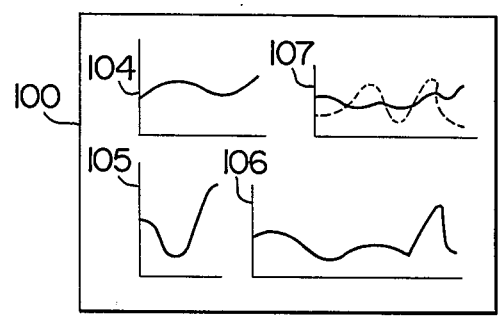
FIG. 3 illustrates a plurality of graphs displayed on the display screen of a CRT display unit.

FIG. 3 illustrates that a plurality of trend graphs can be displayed on a single display screen 100 by the provision of a plurality of such graph display units. It will be seen that four trend graphs 104 to 107 are depicted within the display area of the display screen 100. The present invention contemplates to make improvements in the structure of such a graph display apparatus including a plurality of graph display units for attaining the aforementioned objects.

Figure 4A:
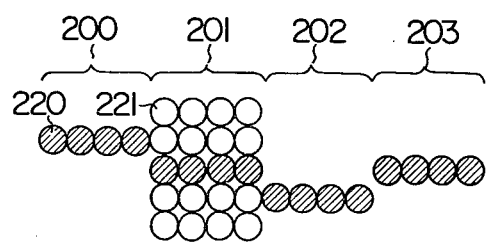
FIGS. 4A to 4C illustrate the manner of graph display with a variable accuracy or resolution.
Figure 4B:
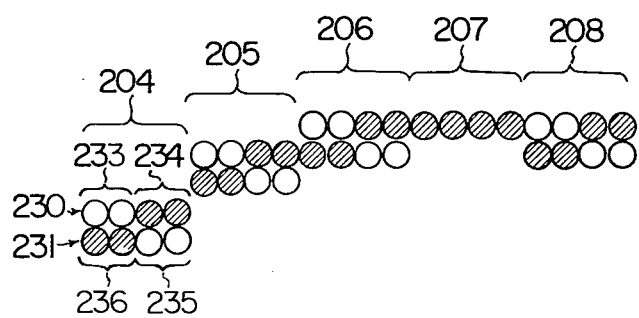
Figure 4C:
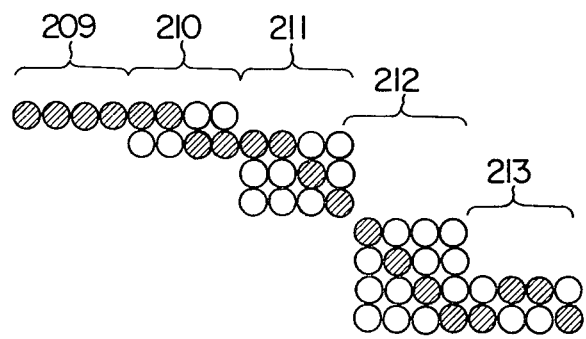

FIGS. 4A to 4C are detail views of part of a display screen for illustrating the manner of high-accuracy graph display according to the present invention. FIG. 4A illustrates a graph display with the standard accuracy. Referring to FIG. 4A, a trend curve is depicted by blank dots (hatched dots) 220 which are unblanking among a plurality of dot groups 200 to 203 corresponding to the individual time points. This trend curve represents an enlarged part of the trend curve 103 shown in FIG. 1. White dots 221 are blanking and provide the background of the trend curve depicted on the display screen 100. It will be seen that only part of such white dots are shown in FIG. 4A to avoid complexity. One time point has a width corresponding to a group of four horizontally aligned dots in FIG. 4A. However, such a dot group is shown by way of example for facilitating the understanding of the variable accuracy or resolution according to the present invention, and the width of one time point is generally not limited to the four dots. The standard accuracy or resolution refers to the allowable limit of depicting as many trend curves as possible, and the width of each time point in such a case is represented by the four dots by way of example. In other words, the standard resolution refers to the case where a plurality of dots horizontally aligned in one time point are simultaneously used as one element of the trend curve to be displayed.

In FIG. 4B, two trend curves each as shown in FIG. 4A are combined to display a single trend curve so that the time axis resolution can be doubled to provide accuracy which is two times that of the trend curve shown in FIG. 4A. Referring to FIG. 4B, each of a plurality of dot groups 204 to 208 corresponding to the individual time points for a graph display with the standard accuracy are divided into a left-hand sub-group and a right-hand sub-group to unblank the dots independently in response to the supply of display data from separate trend curve memories respectively. In the dot group 204, for example, the upper row 230 of four dots include two white dots 233 at the left-hand half and two black dots 234 at the right-hand half, while the lower row 231 include two black dots 236 at the left-hand half and two white dots 235 at the right-hand half. A display data supplied from one of the trend curve memories provides the amplitude value at the upper dot row 230, and another display data supplied from the other trend curve memory provides the amplitude value at the lower dot row 231. Thus, the two trend curves combined into the single trend curve provide a time axis resolution of double accuracy. In the case of the dot group 207, the two trend curves overlap to provide the same amplitude value represented by the four black dots of the left-hand and right-hand subgroups, and no white dots are depicted.

In FIG. 4C, the time axis resolution is two times that in FIG. 4B, that is, four times that in FIG. 4A. In a dot group 209 corresponding to a time point, four trend curves overlap to provide the same amplitude value represented by four black dots. In the next dot group 210 corresponding to the next time point, two black dots and two white dots align on one row, and two white dots an two black dots align on another row, because two of the four trend curves overlap to provide the same amplitude value of one level, while the remaining two trend curves overlap to provide the same amplitude value of another level. In a dot group 211 next to the dot group 210, two of the four trend curves overlap to provide the same amplitude value of one level represented by two black dots, while the remaining two trend curves provide amplitude values of different levels each represented by one black dot. In a dot group 212 next to the dot group 211, the four trend curves provide respective amplitude values of different levels each represented by one black dot. In the case of FIG. 4A illustrating the manner of the graph display with the standard accuracy or resolution, four black dots represent an amplitude value at each time point. In contrast, in the case of FIG. 4C, four trend curves provide amplitude values of different levels represented by four black dots so that the time axis resolution of quadruple accuracy can be obtained.

The basic idea and function of the apparatus according to the present invention will be understood from the above description. An embodiment of the present invention which realizes such a novel function will now be described with reference to FIG. 5.

Referring to FIG. 5, a timing control unit 3000 includes a basic clock pulse generator 300. A first counter 301 counts the clock pulse output of the basic clock pulse generator 300, and the output of the first counter 301 is applied by an output line 350 to a second counter 302 to be counted by the second counter 302. This second counter 302 counts the time points on the time axis to serve the graph display with the standard accuracy. An output line 354 extends from the second counter 302 to a plurality of data selectors 304 to 307 which are connected to a plurality of memories 308 to 311 respectively so as to apply address signals to these memories 308 to 311. The memories 308 to 311 store amplitude values of respective trend curves at the individual time points on the time axis.

The input line 350 to the second counter 302 provides the count-up signal of the first counter 301, and this signal is also used to divide the dots into the dot groups 200 to 213 shown in FIGS. 4A to 4C. In other words, this signal divides the time axis (horizontal axis) into the individual time points. The count-up signal of the second counter 302 appears on a signal line 351 to be applied to a color CRT display unit 3600 and a black-and-white CRT display unit 3601 as a horizontal synchronizing signal representing the scanning period T of the raster scanning the display screen from the left to the right. The signal line 351 is also connected to a raster counter 303 which counts the number of rasters, and the count-up signal of this raster counter 303 is applied by a signal line 352 to the CRT display units 3600 and 3601 as a vertical synchronizing signal.

The count output of the raster counter 303 appears on an output line 355 to be applied to a plurality of comparators 312 to 315. These comparators 312 to 315 are associated with the four trend curves respectively and are associated also with the four memories 308 to 311 respectively each of which stores the amplitude values of one trend curve. The amplitude values stored in the memories 308 to 311 are compared in the comparators 312 to 315 with the raster position represented by the output of the raster counter 303 appearing on the output line 355, so as to detect coincidence therebetween. The coincidence detection signals 360 are applied from these comparators to associated variable accuracy circuits 316 to 319. Each of the graph display units 3100 to 3400 comprises the combination of a memory and a comparator. Thus, in this embodiment, the memories 308 to 311 are combined with the associated comparators 312 to 315 to constitute the four graph display units 3100 to 3400, respectively.

The variable accuracy circuits 316 to 319 include information of the accuracy or resolution of graph display, and the display signal outputs of the graph display units 3100 to 3400 are converted on the basis of the accuracy information. The accuracy information is supplied by a signal line 358 from an external information source such as a keyboard or a computer (not shown). A signal line 359 supplies a timing signal instructing the information set timing. When the variable accuracy circuits 316 and 317 among the four variable accuracy circuits 316 to 319 are used to display a graph with double accuracy, the output of, for example, the circuit 316 is the display signal applied to the CRT display units 3600 and 3601 during the timing of scanning the preceding two dots among, for example, four dots corresponding to one time point. The output of the other circuit 317 is the display signal applied to the CRT display units 3600 and 3601 during the timing of scanning the succeeding two dots among the four dots. In this embodiment, the variable accuracy circuits 316 to 319 include information for specifying the color so that the graph can be displayed in a desired color. Alternatively, means for specifying the color may be separately provided. However, due to the fact that the variable accuracy circuits 316 to 319 are connected to the external information source through the line 358, a color specifying information line is included in the signal line 358 to supply the color information by the color specifying information line. In order to display the color specified by the color information, each of the variable accuracy circuits 316 to 319 applies three output signals corresponding to the red, green and blue information signals emitted from the three electron guns of the color CRT display unit 3600. The signals corresponding to the red, green and blue colors are applied from the variable accuracy circuits 316 to 319 to respective OR gates 320 to 322 constituting an OR circuit 3500. Output signals 364 to 366 appearing from the OR circuit 3500 are therefore representative of the three primary colors respectively and are applied to the color CRT display unit 3600. When the black-and-white CRT display unit 3601 is only provided without the provision of the color CRT display unit 3600, the variable accuracy circuits 316 to 319 need not deliver the three primary color signals, and the OR circuit 3500 includes only one OR gate. An OR gate 3501 may be connected to receive the output signals 364 to 366 of the OR circuit 3500, and the output of this OR gate 3501 may be applied to the black-and-while CRT display unit 3601. Such an arrangement is most preferred when both the color CRT display unit and the black-and-while CRT display unit are provided to display the same graph.

Graph display data are supplied by an input line 357 from the external information source to be written in the memories 308 to 311. Address data specifying the addresses of the graph display data in the memories 308 to 311 are supplied to the data selectors 304 to 307 by an address line 356. In response to the application of the address signal, the data selectors 304 to 307 detect the addresses of the graph display data in the memories 308 to 311. Only when the address data are selected by the data selectors 304 to 307, are the graph display data supplied by the line 357 stored at the corresponding addresses in the memories 308 to 311.

The detailed structure of the four variable accuracy circuits 316 to 319 shown in FIG. 5 will now be described. The detailed structure of the variable accuracy circuit 316 will only be described with reference to FIG. 6 since the circuits 316 to 319 have the same structure.

Referring to FIG. 6, a graph display mode register 500 registers the mode of displaying a graph. This register 500 includes bit stages $D_o$ to $D_3$ registering the information instructing the accuracy of graph display and bit stages R, G and B registering the information specifying the color of graph display. The former and latter information are registered in the form of the binary code of "1" and "0" in the bit stages $D_o$ to $D_3$ and bit stages R, G and B respectively of the display mode register 500. The outputs of the bit stages $D_o$ to $D_3$ of the display mode register 500 are applied to a timing conversion unit 5100 which converts the unblanking timing of dots among a plurality of dots included in the range of each time point. This timing conversion unit 5100 comprises a decoder 5080 including inverters 508a to 508d for decoding the coded outputs of the bit stages $D_o$ to $D_3$ of the register 500, a group of AND gates 513 to 518 receiving their inputs from the inverters 508a to 508d in the decoder 5080 and from the timing control unit 3000 through a signal line 353, and an OR gate 509 providing an output representing the OR logic of the outputs of the AND gates 513 to 518. An AND circuit 5200 delivers output signals 361 to 363 representing the respective color codes in response to the application of the output of the OR gate 509 in the timing conversion unit 5100, the specified color information signal outputs of the bit stages R, G and B of the display mode register 500, and the coincidence detection signal output 360 of the graph display unit 3100. This AND circuit 5200 includes three AND gates 510 to 512 corresponding to the three primary colors of red, green and blue respectively, and the output of the OR gate 509 in the timing conversion unit 5100 and the coincidence detection signal output 360 of the graph unit 3100 are applied in common to all these AND gates 510 to 512.

Figure 7:
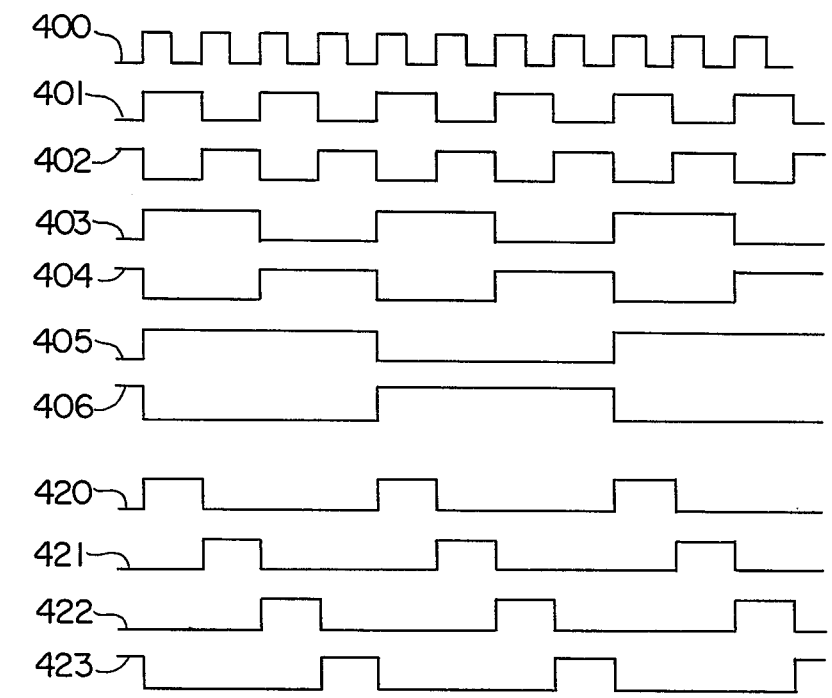
FIG. 7 is a time chart illustrating the operation of the embodiment of the present invention shown in FIGS. 5 and 6.

The count signal input line 353 shown in FIG. 6 is the count output line of the counter 301 in the timing control unit 3000 shown in FIG. 5, and this count signal takes various waveforms as shown in FIG. 7. Referring to FIG. 7, the waveform 400 represents the count timing, and on the basis of this count timing waveform 400, various count signals 401 to 423 appear on the output line 353 of the counter 301. The high level portion of the count signal 405 or 406 corresponds to each length of the dot groups 200 to 213 shown in FIGS. 4A to 4C. In the case of FIG. 4B illustrating the graph display with double accuracy, the display time by one of the two trend curves corresponds to the high level portion of the count signal 403 or 404 shown in FIG. 7, and these count signals 403 and 404 are applied to the respective AND gates 517 and 518 shown in FIG. 6.

The high level portion of the count signal 401 or 402 appearing from the counter 301 is equal to the diameter of one dot shown in FIG. 4C, and the count signals 420 to 423, which are obtained as a result of AND operations on the count signals 401 and 403, on the count signals 402 and 403, on the count signals 401 and 404 and on the count signals 402 and 404, represent the respective positions of the leftmost to rightmost dots in each dot group shown in FIG. 4C. These count signals 420 to 423 are applied by the signal line 353 to the respective AND gates 513 to 516 shown in FIG. 6.

The line 358 shown in FIG. 6 provides data and color information inputs to be registered in the register 500, and the signal line 359 provides the timing of registration of the information inputs.

The graph display mode register 500 employed in the present embodiment includes the three bit stages R, G and B corresponding to the three primary colors of red, green and blue respectively for displaying a graph in one of seven colors as described hereinbefore. The outputs of these bit stages R, G and B are applied to the respective AND gates 510 to 512 in the AND circuit 5200 so that the individual color display signals 361 to 363 can be applied to the OR circuit 3500 shown in FIG. 5 in response to the application of the coincidence detection signal 360 to the AND gates 510 to 512. Thus, this register 500 registers the display mode of the associated trend curve. The individual color display signals 361 to 363 are delivered from each of the variable accuracy circuits 316 to 319 provided for the respective trend curves and are applied to the CRT display unit 3600 through the OR gates 320 to 321 shown in FIG. 5.

The variable accuracy information is set in the bit stages $D_o$ to $D_3$ of the register 500. The information set in the bit stage $D_o$ instructs that the graph display is to be made with the standard accuracy or the accuracy which is n times the standard accuracy, and the output of this bit stage $D_o$ is applied to the OR gate 509 through the inverter 508a. Therefore, when an output of "0" level appears from this bit stage $D_o$, the respective AND gates 510 to 512 of the AND circuit 5200 are enabled to pass the color signals from the bit stages R, G and B of the register 500 in response to the application of the coincidence detection signal 360, while the AND gates 513 to 518 are disabled so as to provide the graph display with the standard accuracy. On the other hand, when an output of "1" level appears from the bit stage $D_o$, the graph can now be displayed with the accuracy which is n times the standard accuracy. More precisely, an output of "0" level appears from the inverter 508a in the decoder 5080, and the AND gates 513 to 518 are enabled or released from the disabled state so that the information set in the bit stages $D_1$ to $D_3$ is now effective.

The operation of the variable accuracy circuit shown in FIG. 6 will be described with reference to the case in which a graph is displayed with the double accuracy by two trend curves as shown in FIG. 4B. In this case, a "0" is set in the bit stage $D_3$ of the register 500 to specify that the accuracy of display be two times the standard accuracy. Suppose that a "0" has already been set in the bit stage $D_2$, the AND gate 517 is turned on, and the count signal 403 shown in FIG. 7 appears from the OR gate 509 so as to display the left-hand half of one time point range of the trend curve with which the variable accuracy circuit shown in FIG. 6 is associated. When a "1" has been set in the bit stage $D_2$, alternatively, the AND gate 518 is turned on to display the right-hand half of the time point range of the trend curve in the same manner as that above described.

In order to display a graph with the quadruple accuracy by four trend curves as shown in FIG. 4C, a "1" is set in the bit stage $D_3$ of the register 500 shown in FIG. 6 to disable the AND gates 517 and 518. The AND gates 513 to 516 are enabled or ready to be turned on, and one of the AND gates 513 to 516 produces an output signal in dependence on the combination of the outputs of the bit stages $D_2$ and $D_1$. This selective turn-on of the AND gates 513 to 516 results in the unblanking of a specific dot in a dot group corresponding to one time point range of the trend curve with which the variable accuracy circuit is associated, as in the case of the graph display with the double accuracy. The information set in the register 500 and the glowing state of dots in displaying a graph with the quadruple accuracy, as well as the graph display with the standard accuracy and double accuracy, are tabulated in Table 1.

TABLE 1

| $D_3$ | $D_2$ | $D_1$ | $D_0$ | Unblanking state of dots in one time point range | Accuracy |
|---|---|---|---|---|---|
| 0 | 0 | 0 | 0 | All dots unblanking | Standard |
| 0 | 0 | 0 | 1 | Left-hand half only unblanking among all dots | |
| | | | | | Double |
| 0 | 1 | 0 | 1 | Right-hand half only unblanking among all dots | |
| 1 | 0 | 0 | 1 | Leftmost one quarter only unblanking among all dots | |
| 1 | 0 | 1 | 1 | Next-to-leftmost one quarter only unblanking among all dots | |
| | | | | | Quadruple |
| 1 | 1 | 0 | 1 | Next-to-rightmost one quarter only unblanking among all dots | |
| 1 | 1 | 1 | 1 | Rightmost one quarter only unblanking among all dots | |

While an embodiment of the present invention has been described in detail, it is apparent that the number n of the n-fold accuracy can be freely selected by suitably designing the structure of the counter 301 and register 500, and it is also apparent that the number of dots in the range corresponding to one time point can be freely selected.

It will be understood from the foregoing detailed description of the present invention that the accuracy of displaying a trend graph can be enhanced as required without any substantial increase in the hardware, and the accuracy of graph display can be freely varied according to a preset program or information supplied from an external source.

We claim:

1. A graph display apparatus comprising:
   a CRT display unit of raster scanning type;
   a raster counter counting the number of scanned rasters to identify the raster number of the scanning line presently scanning the display screen of said CRT display unit;
   at least two graph display units each including a memory having a capacity corresponding to the number of time points on the time axis extending in the scanning direction of the raster on the display screen of said CRT display unit for storing the raster numbers corresponding to the levels of the quantities to be displayed at the individual time points, and a comparator comparing the output of said counter with the output of said memory read out sequentially in timing relation with the individual time points for providing a coincidence detection signal output only when coincidence is reached between the output of said counter and the output of said memory;
   a variable accuracy circuit associated with each of said graph display units for receiving the output of said associated graph display unit thereby providing a display signal output at the timing of scanning of selected number of dots among a plurality of dots corresponding to one time point; and
   an OR circuit provided in common to all of said variable accuracy circuits to receive the outputs of said variable accuracy circuits for applying an output signal representing the logical sum of these inputs to said CRT display unit of raster scanning type.

2. A graph display apparatus as claimed in claim 1, wherein said variable accuracy circuit associated with each of said graph display units comprises a graph display mode register registering information instructing the display accuracy, timing conversion means receiving the accuracy information from said register for selecting, depending on the received accuracy information, a necessary timing signal from among various timing signals applied from external timing control means to produce as its output the selected timing signal, and an AND circuit providing an output signal representing the logical product of the output of said timing conversion means and said coincidence detection signal.

3. A graph display apparatus as claimed in claim 1, wherein said OR circuit comprises three OR gates applying signals corresponding to the three primary colors (red, green and blue) to the three corresponding respective cathodes of said CRT display unit, and said variable accuracy circuit associated with each of said graph display units comprising a graph display mode register registering information instructing the display accuracy and also registering three-bit information specifying the displaying color, timing conversion means receiving the accuracy information from said register for selecting, depending on the received accuracy information, a necessary timing signal from among various timing signals applied from external timing control means so as to produce as its output the selected timing signal, and an AND circuit receiving said three-bit information specifying the displaying color, the output of said timing conversion means and said coincidence detection signal thereby providing an output signal representing the logical product of the output of said timing conversion means and said coincidence detection signal depending on said three-bit color information.

4. A graph display apparatus as claimed in claim 2, wherein said graph display mode register in each of said variable accuracy circuits is a memory for storing binary coded information of "1" and "0" which is programable in a given way by way of a signal line connected to an external signal source.

5. A graph display apparatus as claimed in claim 2, wherein said timing conversion means in each of said variable accuracy circuits comprises a decoder for decoding the output of said graph display mode register, a group of AND gates for receiving the output of said decoder to select one timing signal from among the various timing signals applied from said external timing control means, and an OR gate providing an output signal representing the logical sum of the outputs of said AND gate group.

6. A graph display apparatus comprising:
   a CRT display unit of raster scanning type;
   a raster counter counting the number of scanned rasters to identify the raster number of the scanning line presently scanning the display screen of said CRT display unit;
   at least two graph display units each including a memory having a capacity corresponding to the number of time points on the time axis extending in the scanning direction of the raster on the display screen of said CRT display unit for storing the raster numbers corresponding to the levels of the quantities to be displayed at positions of dots the display of which is allotted to the graph display unit among a plurality of dots corresponding to one time point, and a comparator comparing the output of said counter with the output of said memory read out sequentially in timing relation with the individual time points for providing a coincidence detection signal output only when coincidence is reached between the output of said counter and the output of said memory;
   at least two variable accuracy circuits corresponding to respective graph display units, each variable accuracy circuit receiving the output of the associated one of said graph display units and for delivering the received output from said associated graph display unit as a display signal output only for a timing period for scanning dots selected in accordance with display accuracy information preregistered therein and allotted to said associated graph display unit to be displayed therethrough; and
   an OR circuit provided in common to all of said variable accuracy circuits to receive the outputs of said variable accuracy circuits for applying an output signal representing the logical sum of these inputs to said CRT display unit of raster scanning type.

* * * * *